United States Patent
Lin

(10) Patent No.: US 6,544,853 B1
(45) Date of Patent: Apr. 8, 2003

(54) REDUCTION OF NEGATIVE BIAS TEMPERATURE INSTABILITY USING FLUORINE IMPLANTATION

(75) Inventor: Chuan Lin, Poughquag, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/050,528

(22) Filed: Jan. 18, 2002

(51) Int. Cl.[7] .......................... H01L 21/48; H01L 21/20
(52) U.S. Cl. .................. 438/305; 438/528; 438/535
(58) Field of Search ...................... 438/305, 303, 438/301, 287, 528, 535

(56) References Cited

U.S. PATENT DOCUMENTS

| | | | |
|---|---|---|---|
| 5,750,435 A | * 5/1998 | Pan | 438/525 |
| 5,909,622 A | 6/1999 | Kadosh et al. | 438/286 |
| 5,943,576 A | 8/1999 | Kapoor | 438/302 |
| 6,069,062 A | * 5/2000 | Downey | 438/528 |
| 6,078,089 A | * 6/2000 | Gardner et al. | 257/410 |
| 6,080,629 A | 6/2000 | Gardner et al. | 438/301 |
| 6,117,715 A | 9/2000 | Ha | 438/197 |
| 6,140,191 A | 10/2000 | Gardner et al. | 438/300 |
| 6,187,643 B1 | 2/2001 | Borland | 438/302 |
| 6,288,433 B1 | * 9/2001 | Akram et al. | 257/408 |
| 6,297,106 B1 | * 10/2001 | Pan et al. | 438/287 |
| 6,358,865 B2 | * 3/2002 | Pearce et al. | 438/763 |

* cited by examiner

Primary Examiner—Michael S. Lebentritt
Assistant Examiner—Michael K. Luhrs
(74) Attorney, Agent, or Firm—Jerome J. Norris

(57) ABSTRACT

A process of fabricating a p-type metal oxide semiconductor to affect reduction of negative bias temperature instability (NBTI) in the formed p-type metal oxide semiconductor structure by:

a) forming a gate on a gate oxide in a substrate;

b) forming a spacer on a sidewall of the gate;

c) forming a source/drain extension beside the gate oxide in the substrate or forming a lightly doped drain (LDD) implantation into the gate oxide; and d) implanting $F_2$ between the gate oxide and the source drain extension at a sufficiently large tilted angle and in sufficient amount to affect reduction of negative bias temperature instability characteristics lower than without $F_2$ implantation.

6 Claims, 4 Drawing Sheets

REDUCTION OF NEGATIVE BIAS TEMPERATURE INSTABILITY USING FLUORINE IMPLANTATION

BACKGROUND OF THE INVENTION

1. Field of Invention

The present invention relates to a process of producing PMOSFET (p-metal oxide semiconductor field effect transistor) in a manner so as to reduce the occurrence of negative bias temperature instability. More particularly, the present invention relates to a process for producing PMOSFET characterized by reduction of negative bias temperature instability by treating the structure with titled angled fluorine implantation.

2. Background Art

As electronic apparatus such as integrated circuits become more complicated and their function becomes more powerful, the necessary density of transistors in the integrated circuit increases accordingly. The high density of these complex integrated circuits are not easily achieved by decreasing a layout according to device proportions of the integrated circuits. Instead, the device size must be decreased by a design rule and with consideration for potential change in the physical characteristics of the device.

In the case of producing PMOSFET microelectronic devices, negative bias temperature instability (NBTI) is a limiting factor insofar as the reliability of the PMOSFET is concerned. The basic cause of NBTI remains unknown, and knobs sometimes used to reduce NBTI are very limited.

It is known that fluorine can reduce NBTI; however, fluorine is introduced through a $BF_2$ source/drain self aligned implant or fluorine implant into the poly Si gate. Further, NBTI improves with fluorine dose, and the higher the fluorine dose, the better the improvement in reduction of NBTI.

Despite the foregoing, device optimization and process compatibility in fact determine the fluorine dose that can be used for NBTI improvement. This being the case, the allowable change of fluorine dose is very limited. Unfortunately, this limit severely restricts the ability to reduce NBTI.

While the prevailing belief is that fluorine at the $Si/SiO_2$ interface improves NBTI reliability, nevertheless, the fluorine is diffused either from the poly Si gate or source/drain in the existing techniques of preparing PMOSFET. Accordingly, these traditional techniques are not very efficient in introducing fluorine into $Si/Sio_2$ interface.

U.S. Pat. No. 5,909,622 disclose a method for forming a p-channel transistor, comprising:

providing a silicon substrate having a source region and a drain region spaced by a gate conductor;

exposing the drain region, the source region and the gate conductor to a nitrogen and oxygen ambient to form a nitrided oxide;

implanting a first p-type dopant into the source region and the drain region at an angle within the range between 20° and 70° relative to upper surfaces of the source and drain regions;

depositing a source-side and a drain-side oxide upon the nitrided oxide;

removing the source-side and drain-side oxide except for spacer portions of the source-side and the drain-side oxide adjacent lateral portions of the nitrided oxide, the lateral portions being arranged adjacent opposed sidewall surfaces of the conductor; and implanting a second p-type dopant into areas of the source region and the drain region laterally spaced from the gate conductor by the spacer portions of the source-side and drain-side oxide and the lateral portions of the nitride oxide at an angle perpendicular to upper surfaces of the source and drain regions.

A suitable p-type implant species is $BF_2$.

A method of forming a portion of an MOS transistor that uses angled implant to build MOS transistors in contact holes is disclosed in U.S. Pat. No. 5,943,576. The method entails:

depositing a polysilicon layer over a semiconductor substrate of a first conductivity type;

depositing above the polysilicon layer a dielectric layer and a refractory metal layer;

forming a contact hole through the refractory metal layer, the dielectric layer and the polysilicon layer to expose a portion of the semiconductor substrate;

implanting a dopant at a first angle other than an angle normal to a substrate surface, to form a first source/drain region in the semiconductor substrate under the polysilicon layer on a first side of the contact hole, the first source/drain region having a conductivity type opposite the first conductivity type;

implanting the dopant at a second angle other than an angle normal to the substrate surface, to form a second source/drain region in the semiconductor substrate under the polysilicon layer on an opposite side of the first side of the contact hole, the second source/drain region having a conductivity type opposite the first conductivity type;

removing the refractory metal layer; and forming a gate electrode in the contact hole.

The p-type dopant can be $BF_2$.

U.S. Pat. No. 6,080,629, disclose ion implantation into a gate electrode layer using an implant profile displacement layer. The method of forming the gate electrode for insulated gate field effect transistor (IGFET) comprises:

providing a gate dielectric layer on an underlying semiconductor body;

forming a gate electrode layer on the gate dielectric layer;

forming a displacement layer on the gate electrode layer to form a combined displacement/gate electrode layer;

implanting a first material into the combined displacement/gate electrode layer to form an implant profile of the first material within at least the gate electrode layer; and removing regions of the combined displacement/gate electrode layer to form a gate electrode in remaining regions.

A boron implant step may utilize $BF_2$.

A method of fabricating integrated circuit field effect transistors by performing multiple implants prior to forming the gate insulating layer is disclosed in U.S. Pat. No. 6,117,715. The method entails:

forming a first mask pattern including first openings on a face of an integrated circuit substrate;

implanting ions into the face through the first openings to form buried implants that are remote from the face;

forming a second mask pattern in the first openings;

removing the first mask pattern from the first openings to define second openings on the face of the integrated circuit substrate;

forming surface implants in the integrated circuit substrate, adjacent the face thereof, by implanting ions into the face through the second openings; and forming a gate insulating layer and a gate electrode in the second openings.

The p-type ions may be $BF_2$.

U.S. Pat. No. 6,140,191 disclose a method of making high performance MOSFET with integrated simultaneous formation of source/drain and gate regions, comprising:

forming a first stack on the substrate and a second stack on the substrate in spaced-apart relation to the first stack, the first stack having a first layer and first and second spacers adjacent to the first layer, the second stack having a second layer and third and fourth spacers adjacent to the second layer;

forming a gate dielectric layer on the substrate between the first and second stacks;

forming a first conductor layer on the gate dielectric layer;

forming a first source/drain region beneath the first layer and a second source/drain region beneath the second layer; and removing the first and second layers and forming a first contact on the first source/drain region and a second contact on the second source/drain region.

A p+ implant may be performed using a p-type dopant of $BF_2$.

A simplified semiconductor device manufacturing process using low energy high tilt angle and high energy post-gate ion implantation (POGI) is disclosed in U.S. Pat. No. 6,187,643 B1. The implant parameters suitable for implementing the process includes $BF_2$ as the implant species.

Accordingly, there is a need in the art of preparing PMOSFET to provide a more efficient technique for introducing fluorine into the $Si/SiO_2$ interface to affect reduction in negative bias temperature instability and therefore improve reliability of the PMOSFET.

SUMMARY OF THE INVENTION

One object of the present invention is to provide a process for making PMOSFET characterized by reduced negative bias temperature instability (NBTI) by utilizing a large tilted angle fluorine implant.

Another object of the present invention is to provide a process for making PMOSFET characterized by reduced negative bias temperature instability (NBTI) by implanting fluorine after PMOSFET S/D extension or lightly doped drain (LDD) implant and before second spacer formation that is used for source/drain formation.

A further object of the present invention is to provide a process for making PMOSFET characterized by reduced negative bias temperature instability (NBTI) by placing fluorine closer and more efficiently to the gate oxide interface than has been previously done using prior techniques.

A yet further object of the present invention is to provide a process for making PMOSFET characterized by reduced negative bias temperature instability (NBTI) so that, for the same amount of NBTI reduction, lower dosages of $F_2$ are needed.

A further object yet still of the present invention is to provide a process for making PMOSFET characterized by negative bias temperature instability (NBTI) so that lower NBTI reduction may be obtained at an equivalent fluorine dose.

A still further object of the present invention is to provide a process for making PMOSFET characterized by reduced negative bias temperature instability (NBTI) by providing an additional knob for device design to enable optimization of device performance and simultaneously improve device reliability.

A further object of the present invention is to provide a process for making PMOSFET characterized by reduced negative bias temperature instability (NBTI) that is fully compatible with current CMOS processes and that will require no extra mask.

BRIEF DESCRIPTION OF THE DRAWINGS

The invention is now described with respect to specific embodiments thereof, and reference will be made to the drawings, in which.

DETAILED DESCRIPTION OF THE INVENTION

Figure 1:
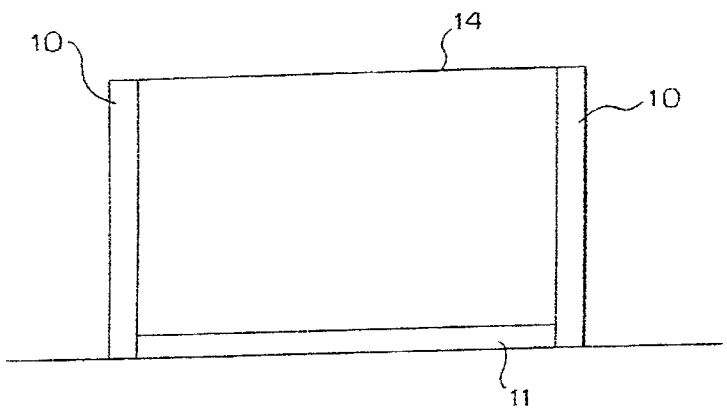
FIG. 1 depicts a prior art PMOSFET that is an N-well (N-doped Si substrate) showing the gate oxide, the poly Si gate and a spacer, which may be optional.

The fabrication of MOSFET devices are well known. For example, MOSFETs are manufactured by placing an undoped polycrystalline (polysilicon) material over a thin gate oxide, whereupon the polysilicon material and gate oxide are patterned to form a gate conductor with source/drain regions adjacent to and on opposite sides of the gate conductor. Thereafter, the gate conductor and source/drain regions are implanted with an impurity dopant material. In the case where the impurity dopant material used for forming the source/drain regions is n-type, the resulting MOSFET is an NMOSFET (n-channel) transistor device. On the other hand, if the source/drain dopant material is p-type, the resulting MOSFET is a PMOSFET (p-channel) transistor device.

The gate conductor and adjacent source/drain regions are produced using well-known photolithography techniques. The gate conductors and source/drain regions generally arise in openings formed through a thick layer known as a field oxide. These openings and the transistors formed therein are referred to as active regions. In other words, the active regions are regions between field oxide regions. A metal interconnect is routed over the field oxide to couple with the polysilicon gate conductor as well as with the source/drain regions to complete formation of an overall circuit structure.

In this art, integrated circuits utilize either n-channel devices or p-channel devices exclusively, or a combination of both on a monolithic substrate. Although both types of devices may be formed, the devices are distinguishable, as mentioned, based upon the source/drain impurity dopant. Significantly, the process by which an n-type dopant is used to form an n-channel device and p-type dopant is used to form a p-channel device involves unique problems associated with each type device. In each type device, as layout densities increase, unique production problems and characteristic device problems are magnified. Therefore, device failure can occur unless adjustments are made to the processing parameters and processing steps. N-channel processing steps are different from p-channel processing steps due to the unique problems of each type of device.

For example, in the PMOSFET, negative bias temperature instability (NBTI) is a limiting factor in terms of reliability of the structure. The fundamental cause of NBTI remains unknown.

Further, knobs that are used to reduce NBTI are very limited. At present, it is known that fluorine introduced as $BF_2$ through a $BF_2$ source/drain self-aligned implant or into the poly Si gate can reduce NBTI.

During formation of the PMOSFET at the poly-Si/$SiO_2$ interface it has been found that there is a threshold voltage shift $\Delta V_{th}$ and degradation of the device after a negative bias temperature stress, whereas under a plus bias temperature stress, the threshold voltage shift ($\Delta V_{th}$)is negligibly small. The $\Delta V_{th}$ is given by a power law, $\Delta V_{th} \sim t^a$, with a=⅓. While not desirous of being bound by a theory, it is believed that the threshold voltage shift during negative bias temperature stress is caused in the Si/$SiO_2$ interfaces rather than in gate insulators.

The $\Delta V_{th}$ during negative bias stress may be written as follows:

$$|\Delta V_{th}| = \Delta V_{tho} \cdot (t/10^4)^a \cdot \exp(-q/kT(\Phi 0 - a \cdot E/2))^1.$$

[1] K. O. Jeppson, et al., J. Appl. Phys., 48, 2004 (1977).

Where $\Phi$ is a zero-field activation energy, and q·a·E is an energy gain in oxide field E.

To set forth the context of the invention clearly, reference is made to FIG. 1, which depicts a prior art PMOSFET with an N-well (N-doped Si substrate), wherein an optional spacer 10 is formed on the side wall of the poly Si gate deposited above the gate oxide 11.

Figure 2:
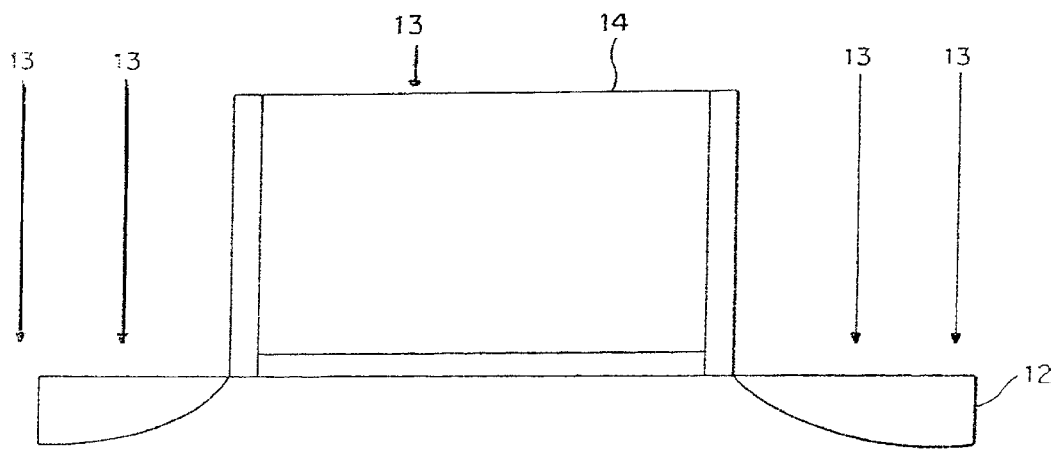
FIG. 2 shows a source/drain extension for ion implantation of the structure of FIG. 1 using $B/BF_2$, in which there is also implantation into the gate.

A source-drain extension 12 is formed beside the gate oxide, as shown in FIG. 2, whereupon an ion implantation using B/$BF_2$ and designed by reference numeral 13 affects implantation into the source/drain extension as well as the poly Si gate 14.

Figure 3:
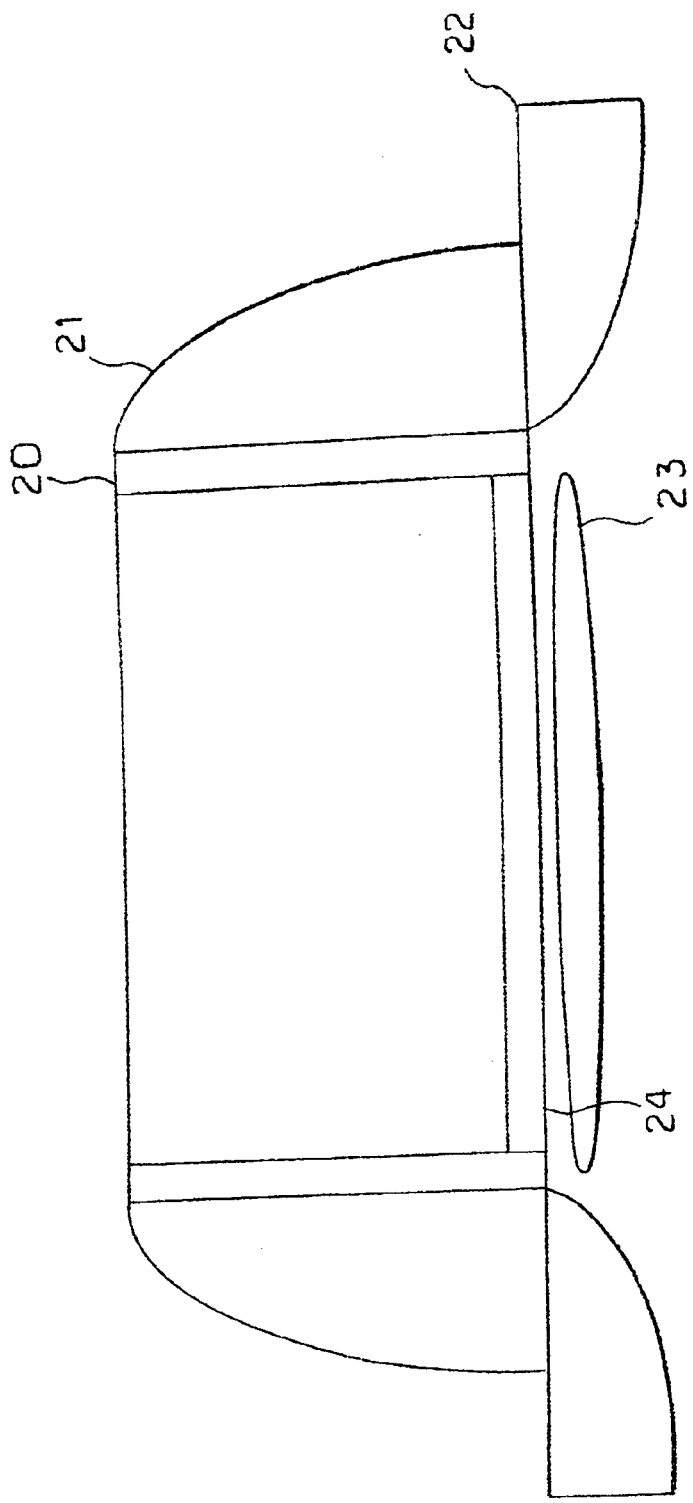
FIG. 3 shows a second PMOSFET of the prior art in which two spacers are deployed and wherein $B/BF_2$ is implanted into the gate.

A second PMOSFET structure of the prior art in which two spacers are utilized in the manufacturing process, is shown in FIG. 3. The first spacer 20 is formed on the side wall of the poly Si gate and the second spacer 21 is formed on the side wall of the first spacer and above the source/drain extension 22. In this structural configuration, B/$BF_2$, as designated by reference numeral 23 is implanted into the gate oxide 24.

Figure 4:
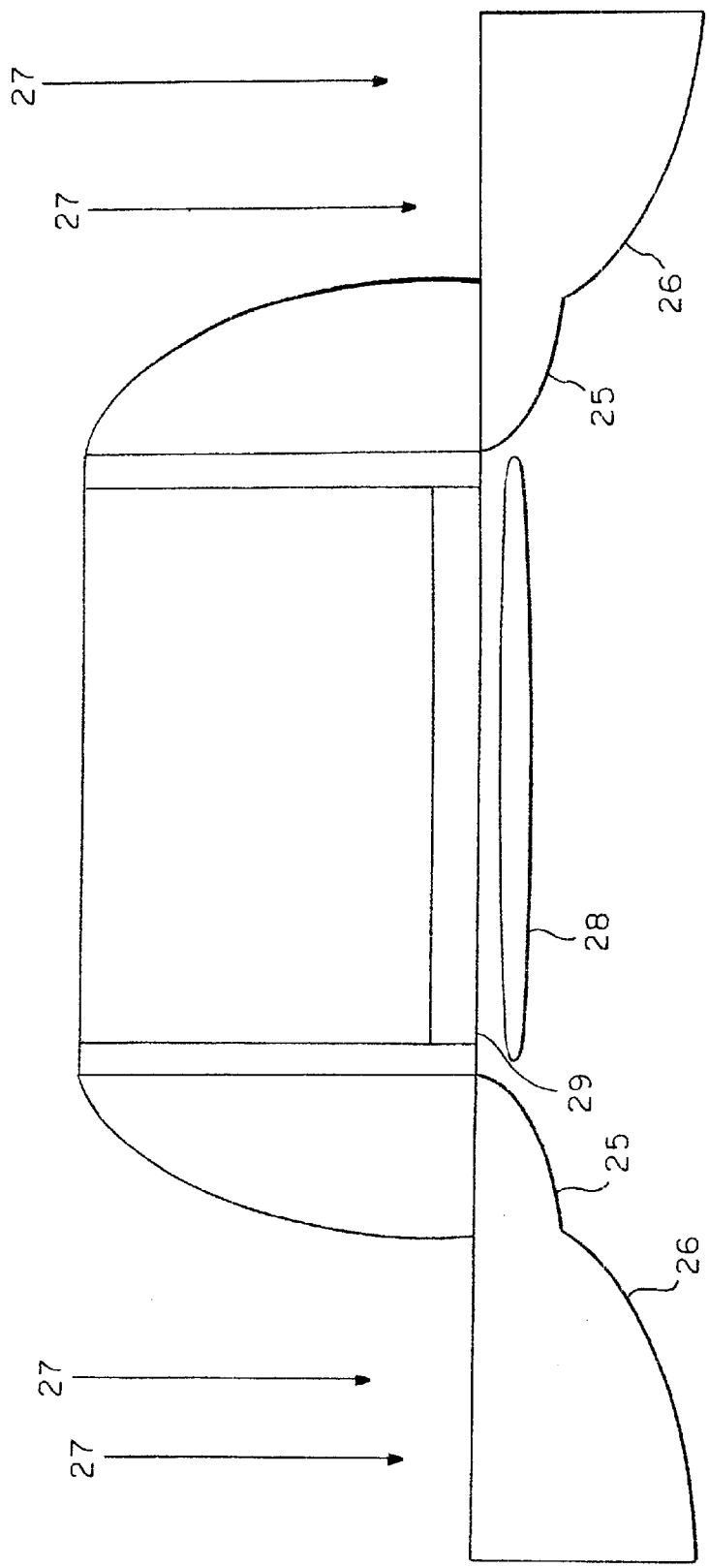
FIG. 4 shows a PMOSFET of the prior art characterized by a source/drain and a source/drain extension, and wherein $B/BF_2$ implantation is implanted in the source/drain and into the gate.

In the prior art PMOSFET structure of FIG. 4, the structure is characterized by a source drain extension 25 and a source drain 26, and ion implantation using B/$BF_2$ as designated by reference numeral 27, is affected on the source drain 26. Also, B/$BF_2$ as designated by reference numeral 28 is used to affect implantation of B/$BF_2$ into the gate oxide 29.

The implantation of B/$BF_2$ ions shown in FIGS. 1 through 4 of the prior art are not efficient methods of introducing $F_2$ into the Si/$SiO_2$ interface, and therefore produces a structure that is unreliable because of the instability of the structure as a result of the degradation to the structure which occurs after negative bias temperature stress.

The invention process results in reduction of negative bias temperature instability in a PMOSFET structure by utilizing a large tilted angled $F_2$ implantation that is introduced more closely to the Si/$SiO_2$ interface.

When using the $F_2$ implantation, any large tilted angle that is sufficient to affect implantation closely to the Si/$SiO_2$ interface will suffice as long as the dosage level of $F_2$ in combination with said angle is sufficient to cause reduction of negative bias temperature instability compared to the use of B/$BF_2$ implantation or doping. However, in the context of the invention, an angle from about 45 to about 75 degrees is preferred in combination with preferred $F_2$ dosage amounts of from about 5e12 to about 1e14/$cm^2$.

Figure 5:
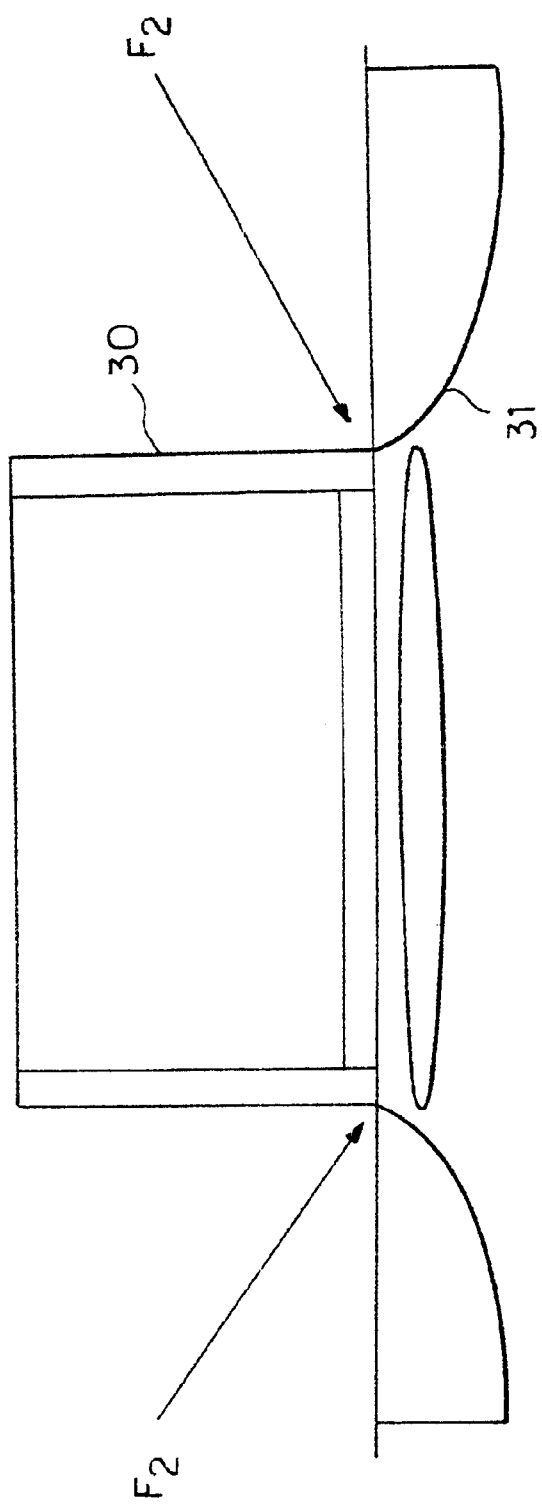
FIG. 5 shows a large tilted angle $F_2$ implantation into a PMOSFET structure using the invention process, in which implantation is made between the poly Si gate and before the second spacer formation.

The invention process is depicted in FIG. 5, in which $F_2$ is implanted in a dosage of from about 5e12 to about 1e14/$cm^2$ at an angle of from about 45 to about 75 degrees between the poly Si gate 30 and the source/drain extension 31. In the invention process integration scheme, $F_2$ is implanted after formation of the PMOSFET S/D extension or lightly-doped drain (LDD) implantation of B/$BF_2$ and prior to formation of the second spacer that is used for the source/drain implant.

The advantage of this large titled angle implant of $F_2$ is that $F_2$ is placed closer and more efficiently next to the gate oxide interface than traditional techniques. This new technique is more effective in NBTI reduction than the traditional ones and the same amount of NBTI reduction can be achieved at lower $F_2$ doses. Further, more NBTI reduction can be obtained by this new technique than at the equivalent fluorine dose using B/$BF_2$. Another advantage of the invention process is that it provides additional knobs for device design. This new process allows the device engineer to optimize device performance and improve device reliability simultaneously. Further still, this new technique is very simple and fully compatible with current CMOS processes and no extra mask is needed.

The invention has been described with respect to a specific embodiment, and it is to be understood that many modifications and changes are possible within the scope of the invention without departing from the spirit of the invention as set forth in the claims.

What is claimed is:

1. A process of fabricating a PMOSFET to affect reduction of negative bias temperature stress in the formed p-type metal oxide semiconductor structure, comprising:

a) forming a poly Si gate in a substrate;

b) forming a spacer on a sidewall of the gate;

c) forming a source/drain extension beside the gate oxide in the substrate;

d) implanting $F_2$ between the poly Si gate and said source drain extension at a sufficiently large tilted angle and in amounts of from about 5e12 to about 1e14/$cm^2$ to affect reduction of negative bias temperature stress compared to an equivalent fluorine dose B/$BF_2$ implantation; and e) forming a second spacer on the sidewall of said spacer in step b) and above said source/drain extension.

2. The process of claim 1 wherein in place of step c), a lightly doped drain (LDD) implantation of B/$BF_2$ is formed into said gate oxide; and in place of step d) implanting $F_2$ after said lightly-doped drain implantation of B/$BF_2$ and prior to formation of said second spacer in step e).

3. The process of claim 1 wherein said implantation of $F_2$ introduces $F_2$ in a Si/$SiO_2$ interface.

4. The process of claim 1 wherein said sufficiently large tilted angle is from about 45 to about 75 degrees from the horizontal.

5. The process of claim 4 wherein said large tilted angle is 45 degrees from the horizontal.

6. The process of claim 4 wherein said large tilted angle is 75 degrees from the horizontal.

* * * * *